(12) United States Patent
Pawlak

(10) Patent No.: US 7,491,616 B2
(45) Date of Patent: Feb. 17, 2009

(54) METHOD OF MANUFACTURING A SEMICONDUCTOR DEVICE INCLUDING DOPANT INTRODUCTION

(75) Inventor: Bartlomiej Jan Pawlak, Lueven (BE)

(73) Assignee: NXP B.V., Eindhoven (NL)

( * ) Notice: Subject to any disclaimer, the term of this patent is extended or adjusted under 35 U.S.C. 154(b) by 72 days.

(21) Appl. No.: 10/598,744

(22) PCT Filed: Mar. 7, 2005

(86) PCT No.: PCT/IB2005/050825

§ 371 (c)(1),
(2), (4) Date: Sep. 11, 2006

(87) PCT Pub. No.: WO2005/091344

PCT Pub. Date: Sep. 29, 2005

(65) Prior Publication Data

US 2007/0173041 A1    Jul. 26, 2007

(30) Foreign Application Priority Data

Mar. 15, 2004   (EP) .................................. 04101056

(51) Int. Cl.
*H01L 21/26* (2006.01)
(52) U.S. Cl. ....................... 438/305; 438/306; 438/528; 257/E21.619
(58) Field of Classification Search ................. 438/305, 438/306, 528, FOR. 188; 257/E21.619
See application file for complete search history.

(56) References Cited

U.S. PATENT DOCUMENTS 4,584,026 A * 4/1986 Wu et al. ..................... 438/528
5,145,794 A * 9/1992 Kase et al. ................... 438/515

(Continued)

OTHER PUBLICATIONS

Ya, L., "The Effect of Fluorine on the Redristribution of Boron in Ion-implanted Silicon", J. Appl. Phys.74(10), Nov. 15, 1993, pp. 6020-6022.*

(Continued)

*Primary Examiner*—George Fourson
(74) *Attorney, Agent, or Firm*—Peter Zawilski

(57) ABSTRACT

The invention relates to a method of manufacturing a semiconductor device (10) in which a semiconductor body (1) of silicon is provided, at a surface thereof, with a semiconductor region (4) of a first conductivity type, in which region a second semiconductor region (2A, 3A) of a second conductivity type, opposite to the first conductivity type, is formed forming a pn-junction with the first semiconductor region (4) by the introduction of dopant atoms of the second conductivity type into the semiconductor body (1), and wherein, before the introduction of said dopant atoms, an amorphous region is formed in the semiconductor body (1) by means of an amorphizing implantation of inert atoms, and wherein, after the amorphizing implantation, temporary dopant atoms are implanted in the semiconductor body (1), and wherein, after introduction of the dopant atoms of the second conductivity type, the semiconductor body is annealed by subjecting it to a heat treatment at a temperature in the range of about 500 to about 800° C., preferably from 550 to 750° C. Dopant atoms of the second conductivity type are introduced into the semiconductor body (1) by means of ion implantation. In this way pn-junctions are formed which are very suitable for forming source and drain extensions (2A, 3A) of a MOSFET that are very shallow, thermally stable, steep and low ohmic.

20 Claims, 3 Drawing Sheets

U.S. PATENT DOCUMENTS

Figure 1:
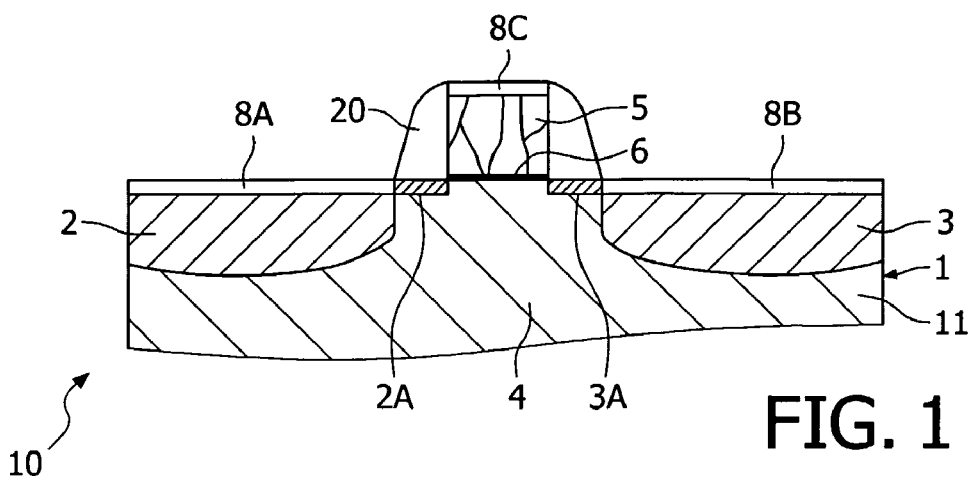
Figure 2:
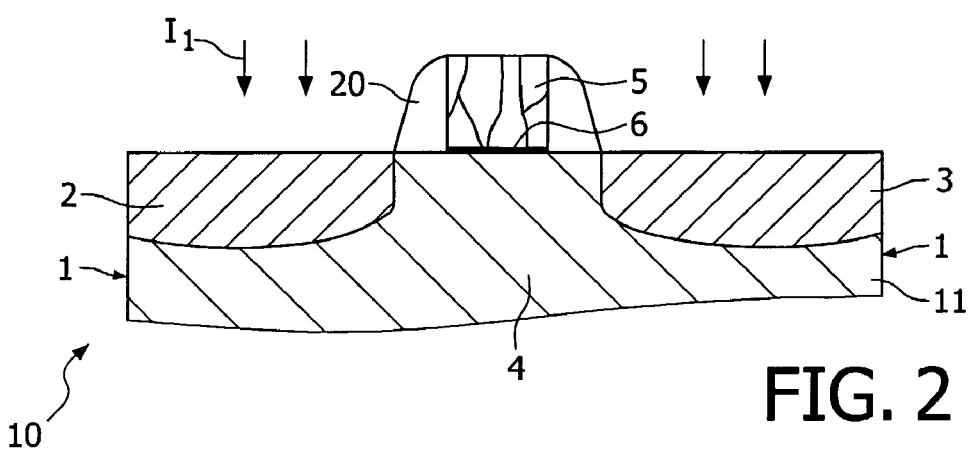
Figure 3:
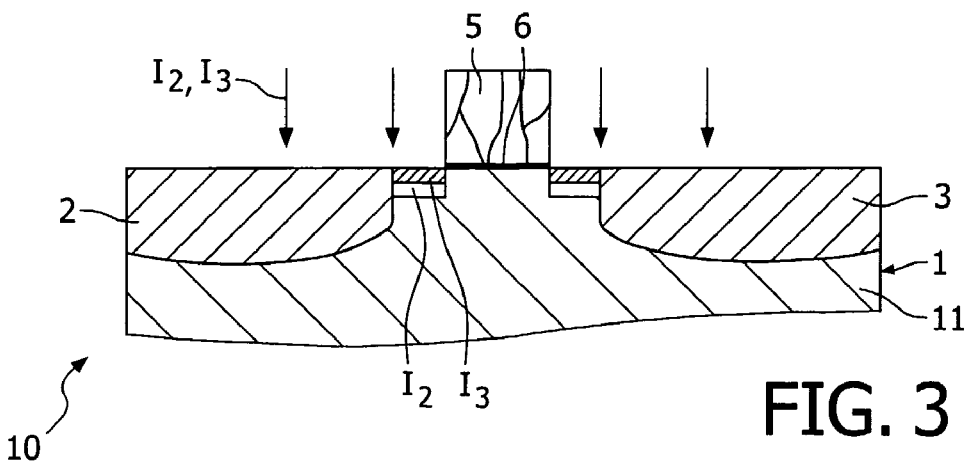
Figure 4:
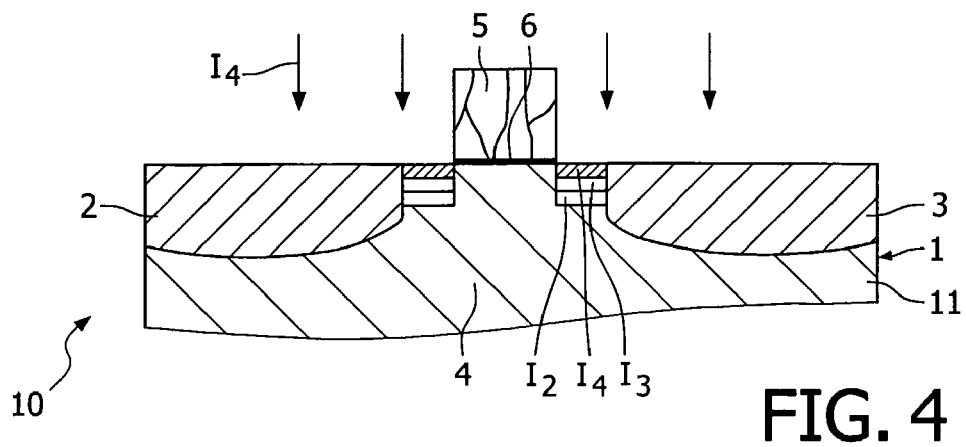
Figure 5:
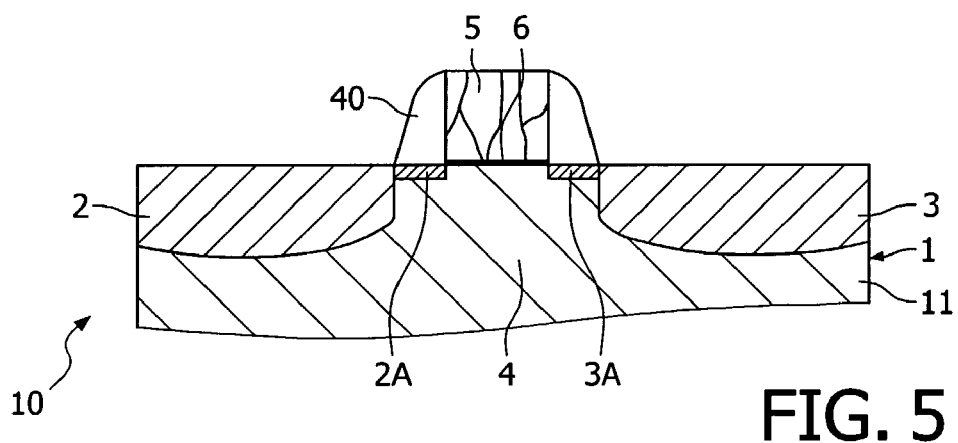
Figure 6:
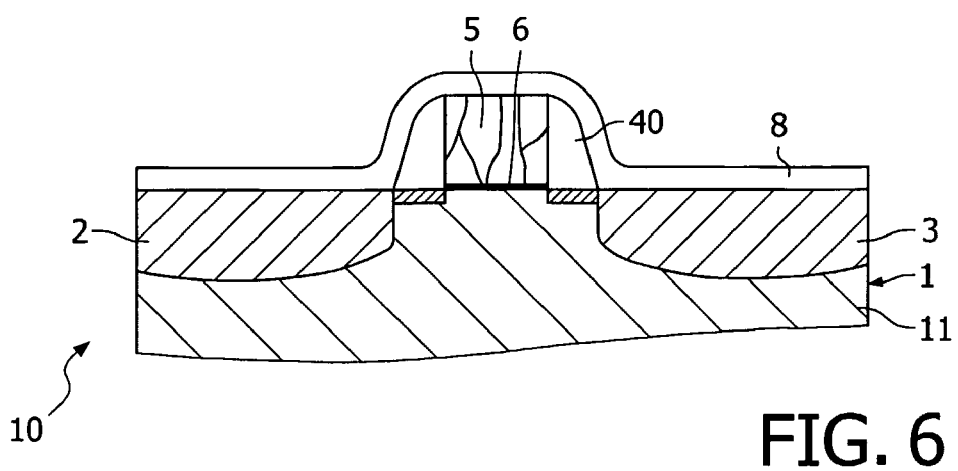

| | | | | |
|---|---|---|---|---|
| 5,407,838 | A * | 4/1995 | Ohnishi et al. | 438/369 |
| 5,969,398 | A * | 10/1999 | Murakami | 257/412 |
| 6,037,640 | A * | 3/2000 | Lee | 257/408 |
| 6,069,062 | A * | 5/2000 | Downey | 438/528 |
| 6,087,209 | A * | 7/2000 | Yeap et al. | 438/197 |
| 6,261,889 | B1 * | 7/2001 | Ono | 438/232 |
| 6,936,505 | B2 * | 8/2005 | Keys et al. | 438/166 |
| 2001/0041432 | A1 * | 11/2001 | Lee | 438/530 |
| 2003/0029119 | A1 | 2/2003 | Coleman | |
| 2003/0109119 | A1 * | 6/2003 | Chakravarthi et al. | 438/563 |
| 2003/0207542 | A1 * | 11/2003 | Chidambaram et al. | 438/305 |
| 2004/0173843 | A1 * | 9/2004 | Noda | 257/327 |
| 2004/0235280 | A1 * | 11/2004 | Keys et al. | 438/528 |
| 2005/0158956 | A1 * | 7/2005 | Poon et al. | 438/282 |
| 2006/0205192 | A1 * | 9/2006 | Walther et al. | 438/513 |
| 2006/0223264 | A1 * | 10/2006 | Park et al. | 438/266 |
| 2007/0161219 | A1 * | 7/2007 | Giles | 438/530 |

OTHER PUBLICATIONS

Huang, T.H., "Influence of Fluorine Preamorphization on the Diffusion oand Activiation of Low-Energy Implanted Boron During Rapid Thermal Annealing", Appl. Phys. Lett. 65(14), Oct. 3, 1994, pp. 1829-1831.*

Saito, S., "Defect Reduction by MeV Ion Implantation for Shallow Junction Formation", Appl. Phys. Lett. 63(2), Jul. 12, 1993, pp. 197-199.*

* cited by examiner

METHOD OF MANUFACTURING A SEMICONDUCTOR DEVICE INCLUDING DOPANT INTRODUCTION

The invention relates to a method of manufacturing a semiconductor device in which a semiconductor body of silicon is provided, at a surface thereof, with a semiconductor region of a first conductivity type, in which region a second semiconductor region of a second conductivity type, opposite to the first conductivity type, is formed forming a pn-junction with the first semiconductor region by the introduction of dopant atoms of the second conductivity type into the semiconductor body, and wherein, before the introduction of said dopant atoms, an amorphous region is formed in the semiconductor body by means of an amorphizing implantation, and wherein, after the amorphizing implantation, temporary dopant atoms are implanted in the semiconductor body, and wherein, after introduction of the dopant atoms of the second conductivity type, the semiconductor body is annealed by subjecting it to a heat treatment.

Such a method is very suitable for making devices with very shallow, steep and low-ohmic pn-junctions and in particular for making MOSFET (=Metal Oxide Semiconductor Field Effect Transistor) devices. In future CMOS (=Complementary MOS) technology such a pn-junction is required, among others, for the formation of source and drain extensions. This is not easy in particular for future so-called sub-65 nm technologies.

A method as mentioned in the opening paragraph is known from US patent application US 2003/0109119 A1 that has been published on Jun. 12, 2003. Therein such a method is described in which a MOSFET is made using the formation of a pn-junction in the manner described above to form the source and drain extensions. First an amorphizing implantation is done; next an implantation of temporary dopant atoms in the form of Fluor atoms is performed. The dopant atoms in the form of Boron atoms are introduced into the semiconductor body by means of out-diffusion from a layer of solid material deposited on the surface of the semiconductor body and containing a sufficient concentration of the dopant atoms like boron. Finally, the semiconductor body is annealed using a short heat treatment in the temperature range of about 950 degrees Celsius to about 1100 degrees Celsius.

A drawback of such a method is that the pn-junctions obtained still are not always shallow, steep and sufficiently low ohmic for future requirements.

It is therefore an object of the present invention to avoid the above drawbacks and to provide a method, which does provide very shallow, steep and low-ohmic pn-junctions in particular for the formation of source and drain extensions of MOSFETs.

To achieve this, a method of the type described in the opening paragraph is characterized in that the dopant atoms of the second conductivity type are introduced into the semiconductor body by means of ion implantation and the semiconductor body is annealed by a heat treatment at a temperature in the range of about 500 to about 800 degrees Celsius. The invention is first of all based on the recognition that ion implantation, which is a process suited for application on an industrial scale, is suitable for forming very shallow, steep and low-ohmic pn-junctions provided that the thermal budget of the process is limited. A further insight is that the annealing process of the known method still contributes significantly to said budget due to its relatively high temperature. Diffusion of the dopant atoms like boron cannot be prevented sufficiently during such a step. The invention is further based on the surprising recognition that annealing at intermediate temperatures, e.g. in the range of 800 to 950 degrees Celsius, is not suitable because at these temperature a deactivation occurs of the Boron atoms which is accompanied by an increase of the (sheet) resistance of e.g. a source or drain extension, and thus is not optimal. Below 500 degrees Celsius, too much time is needed or annealing does not occur at all. Finally, the invention is based on the recognition that on the one hand a low temperature is suitable for completely annealing the semiconductor body and on the other hand it prevents or in any case strongly limits diffusion of the dopant atoms because the time needed for such a low temperature SPE (=Solid Phase Epitaxy) process is still relatively short. The presence of e.g. a fluor profile between the profile of the dopant atoms not only reduces the diffusion of the dopant atoms but, since it separates the so-called end of range damage of the amorphizing implantation from the dopant atoms, also prevents or in any case reduces the deactivation of the dopant atoms present at the upper end of the temperature range in a method according to the invention.

Thus, with a method according to the invention a pn-junction is obtainable which is steep and shallow and which has a very high doping concentration on one of its sides, i.e. a low resistance on that side. It is to be noted that in a method as shown in US patent application 2003/0207542, published on Nov. 6, 2003, ion implantation is applied for the introduction of the Boron atoms into the semiconductor body. A single anneal has been applied in this document, also at a high temperature ranging from 900 to 1075 degrees Celsius.

In a preferred embodiment the semiconductor body is annealed by a heat treatment at a temperature in the range of 550 to about 750 degrees Celsius. In this way the deactivation of dopant atoms is nearly completely avoided.

Preferably the implantation of the temporary dopant atom is performed before the implantation of the dopant atoms of the second conductivity type, and between these implantations the semiconductor body is annealed by a further heat treatment in the same temperature range as the other heat treatment. In this way the influence of the annealing process on the diffusion of dopant atoms can be further limited. In the case that only one annealing step is used at the end of the process, the order of the implantations of the temporary dopants and the dopant atoms can be chosen to be the same although a reverse order is feasible in such a case.

In a further preferred embodiment of the method according to the invention, the semiconductor device is formed as a field effect transistor, and the semiconductor body of silicon is provided, at the surface thereof, with a source region and a drain region of the second conductivity type which are both provided with extensions, and with a channel region of the first conductivity type between the source region and the drain region, and with a gate region separated from the surface of the semiconductor body by a gate dielectric above the channel region, the first semiconductor region being formed as a part of the channel region and the source and drain extensions being formed by the second semiconductor region. In this way a MOSFET device is obtainable with excellent properties in a future, sub-65 nm, CMOS process. Preferably, for the first conductivity type the n-conductivity type is chosen, for the dopant atoms of the second conductivity type Boron atoms are chosen and for the temporary dopant atoms Fluor atoms are chosen. In this way a PMOSFET is obtained. In addition NMOSFETs can be made in the same process and possibly in a similar manner. Other atoms might be used for the temporary dopant atoms, the choice of which might depend on the kind of transistor to be formed.

Preferably, for the amorphizing implantation of inert ions, ions are chosen from a group comprising Ge, Si, Ar or Xe.

Suitable times for the annealing heat treatments are found to be between 1 second and 10 minutes. If only one final heat treatment is used, a suitable time at 550 degrees Celsius is about 10 minutes, at 650 degrees Celsius about 1 minute, at 700 degrees Celsius about 20 seconds, and at 750 degrees Celsius about 1 second. If a heat treatment is applied between the implantation of the temporary dopant and the implantation of the dopant of the second conductivity type, a suitable time lies in the range of 20 seconds to 10 minutes. The final heat treatment times are lower in this case, e.g. in the range of 1 minute to 5 seconds in the temperature range of 550 degrees Celsius to 650 degrees Celsius.

The invention also comprises a semiconductor device obtained with a method according to the invention. Preferably such a device comprises a field effect transistor of which the source and drain extensions are made as described above.

Figure 7:
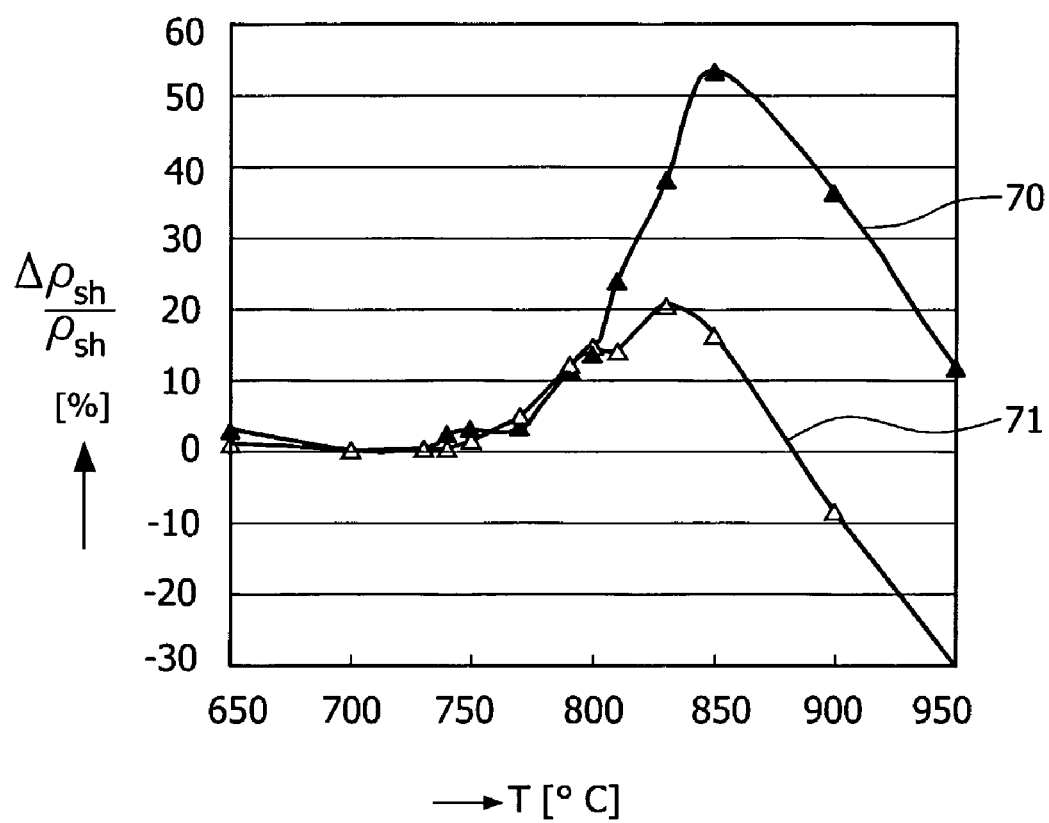

These and other aspects of the invention will be apparent from and elucidated with reference to the embodiments described hereinafter, to be read in conjunction with the drawing, in which FIG. 1 is a sectional view of a semiconductor device obtained with a method according to the invention, FIGS. 2 through 6 are sectional views of the semiconductor device of FIG. 1 at various stages in the manufacture of the device by means of a method in accordance with the invention, and FIG. 7 shows the normalized sheet resistance change of two test samples as a function of the annealing temperature.

The Figures are diagrammatic and not drawn to scale, the dimensions in the thickness direction being particularly exaggerated for greater clarity. Corresponding parts are generally given the same reference numerals and the same hatching in the various Figures.

FIG. 1 is sectional view of a semiconductor device obtained with a method according to the invention. The device 10, which in this case is a PMOST, comprises a semiconductor body 1 made of n-type silicon, here an n-type silicon substrate 11. The device 10 in practice contains, near its borders, isolation regions such as a so-called trench or LOCOS (=Local Oxidation of Silicon) isolation, which is not shown however in the drawing. In practice the device 10 will contain many transistors of both the NMOS and the PMOS type. At the surface of the semiconductor body there are a, in this case p-type, source region 2 and drain region 3 provided with—also p-type—extensions 2A,3A that are more shallow and border a, in this case n-type, channel region 4 above which a dielectric region 6 is present, here comprising silicon dioxide, which separates the channel region 4 from a gate region 5, here comprising polycrystalline silicon. Spacers 20, in this case also of silicon dioxide, border the gate region 5. On top of the source, drain and gate regions (2,3,5) a metal silicide (8A,8B,8C) is present functioning as a connection region.

FIGS. 2 through 5 are sectional views of the semiconductor device of FIG. 1 at various stages in the manufacture of the device by means of a method in accordance with the invention. The starting point for the manufacture of the device 10 is (see FIG. 2) an n-type silicon substrate 11—or a p-type substrate provided with a so-called n well, which may form the channel region 4 of a PMOST—which substrate, in this case, also forms the semiconductor body 1. In the body 1, isolation regions—not shown in the drawing—are formed. Subsequently on the surface of the silicon body 1 a gate dielectric 6 of a silicon oxide is formed, in this case by means of thermal oxidation. Next a polycrystalline silicon layer 5 is deposited on the gate dielectric layer 6 by means of CVD in a usual manner. Its thickness is in this example 100 nm. A mask—not shown in the drawing—is deposited on the structure at the area of the gate 5 to be formed, e.g. comprising a resist and formed by means of photolithography. Outside the mask, the layers 5,6 are removed by means of etching and in this way the gate stack, comprising gate 5 and gate dielectric 6, is formed.

Subsequently spacers 20, e.g. of silicon dioxide, are formed at both sides of the gate stack by depositing a uniform layer of said material on the device 10 and by anisotropic etching thereof, such that it is removed again in the planar regions of the device. Now a deeper p+ type, in this case of boron ions, implantation $I_1$ is done in order to form source and drain 2,3. The semiconductor body is then annealed at a temperature >1000° C. in order to activate the source and drain implantations.

The spacers 20 are then removed (see FIG. 3) before making the extensions 2A,3A. This is done in this example by a series of three ion implantations $I_{2,3,4}$. A first implantation $I_2$ comprises amorphizing a part of the semiconductor body 1, of which the relevant part in the drawing is also marked $I_2$, and is done by implanting germanium ions into the semiconductor body 1, in this example at an implantation energy in the range of 10 to 30 keV and with a dose of about $10^{15}$ at/cm². Then a second implantation $I_3$ is done to form the region $I_3$ that comprises the temporary dopant atoms, in this case Fluor atoms. This implantation is done at an implantation energy in the range of 3 to 10 keV while the implantation dose is also about $10^{15}$ at/cm². Subsequently the semiconductor body 1 is exposed to a first annealing treatment at a temperature of about 600 degrees Celsius for a few minutes.

Next (see FIG. 4) the semiconductor body 1 is exposed to a third ion implantation $I_4$ in which the dopant atoms, here Boron atoms, are introduced into the semiconductor body 1. This is done with an implantation energy between 0.5 and 3 keV and with a dose in the range of about $5 \times 10^{14}$ at/cm² to about $5 \times 10^{15}$ at/cm². Thus, the position of the fluor implantation is approximately between the boron profile and the range of the amorphizing implantation. Next the amorphous silicon of the implantations is further recovered in a second annealing process at a temperature between 550 and 750 degrees Celsius. In this case also at a temperature of 600 degrees Celsius and during 20 seconds.

In this way (see FIG. 5) a very abrupt and narrow profile of the Boron atoms in the source and drain extensions 2A,3A is obtained while these regions have a very high Boron concentration and thus a very low resistance. Subsequently new spacers 40 are formed in a similar way as described above. This is followed (see FIG. 6) by the deposition of a metal layer 8, e.g. of titanium, by which, after moderate heating, silicide regions acting as connection regions are formed. Unreacted parts of the metal layer 8 can be removed by etching after which the structure shown in FIG. 1 results.

Finally (see FIG. 8) the manufacture of the n-MOSFET is further completed by deposition of a pre-metal dielectric, e.g. of silicon dioxide, followed by patterning thereof, and deposition of a contact metal layer, e.g. of aluminum, which is also patterned, thereby forming contact regions. These steps are not shown in the drawing.

FIG. 7 shows the normalized sheet resistance change of two test samples as a function of the annealing temperature. The relative sheet resistance change $\Delta\rho/\rho$, which is normalized with respect to the sheet resistance $\rho$ at 700 degrees Celsius, is shown as a function of temperature T for two samples. Curve 70 corresponds to a test layer formed by the above implantations $I_2$ and $I_4$, i.e. the amorphizing and the dopant implantations, whereas curve 71 corresponds to a test layer formed by the above-mentioned implantations $I_2$, $I_3$ and $I_4$, i.e. the amorphizing, temporary dopant and dopant implantations. Both curves 70,71 show that for an annealing temperature above about 750 degrees, an increase of the sheet resistance occurs with a maximum of about 55% and about 20%, respectively. At temperatures below 750 degrees, the sheet resistance is not detrimentally influenced in both cases. The difference between the two curves 70,71 shows that the presence of the temporary atoms, in this case fluor atoms, has an important beneficial effect on the increase of the sheet resistance at higher temperatures. Thus, in a method according to the invention, if the envisaged thermal budget is moderately exceeded this does not have a strong detrimental effect on the quality of a boron doped layer thanks to the presence of the temporary dopant atoms, i.e. the Fluor atoms.

It will be obvious that the invention is not limited to the examples described herein, and that within the scope of the invention many variations and modifications are possible to those skilled in the art.

The invention claimed is:

1. Method of manufacturing a semiconductor device, the method comprising;
   providing a semiconductor body of silicon, at a surface thereof, with a first semiconductor region of a first conductivity type, in which region a second semiconductor region of a second conductivity type, opposite to the first conductivity type, is formed forming a pn-junction with the first semiconductor region by the ion implantation of dopant atoms of the second conductivity type into the semiconductor body, and
   wherein, before the introduction of said dopant atoms, an amorphous region is formed in the semiconductor body by an amorphizing implantation of inert atoms, and wherein, after the amorphizing implantation, temporary dopant atoms are implanted in the semiconductor body before the implantation of the dopant atoms of the second conductivity type, and between these implantations the semiconductor body is low-temperature annealed, and wherein, after introduction of the dopant atoms of the second conductivity type, the semiconductor body is further annealed by subjecting it to a heat treatment at a temperature in the range of about 500 to about 800 degrees Celsius.

2. Method according to claim 1, characterized in that the semiconductor body is annealed in at least one instance by a heat treatment at a temperature in the range of 550 to about 750 degrees Celsius.

3. Method according to claim 1, characterized in that the low-temperature anneal implantation of the temporary dopant atom is performed before the implantation of the dopant atoms of the second conductivity type, and between these implantations the semiconductor body is low-temperature annealed by a further heat treatment in the same temperature range as the other heat treatment.

4. Method according to claim 1 wherein the semiconductor device is formed as a field effect transistor, in which method the semiconductor body of silicon is provided, at the surface thereof, with a source region and a drain region of the second conductivity type, which are both provided with extensions, and with a channel region of the first conductivity type between the source region and the drain region, and with a gate region separated from the surface of the semiconductor body by a gate dielectric above the channel region, characterized in that first semiconductor region is formed as a part of the channel region and the source and drain extensions are formed as a part of the second semiconductor region.

5. Method as claimed in claim 1, characterized in that for the first conductivity type the n-conductivity type is chosen, for the dopant atoms of the second conductivity type Boron atoms are chosen and for the temporary dopant atoms Fluor atoms are chosen.

6. Method according to claim 3, characterized in that for the amorphizing implantation of inert ions, ions are chosen from a group consisting of Ge, Si, Ar or Xe.

7. Method as claimed in claim 1, characterized in that for the annealing heat treatments a time is chosen between 1 second and 10 minutes.

8. A semiconductor device obtained with a method as claimed in claim 1.

9. A semiconductor device as claimed in claim 8, characterized in that the device comprises a field effect transistor.

10. A method according to claim 1, wherein the further anneal is carried out at a temperature to mitigate the deactivation of the dopant atoms of the second conductivity type.

11. Method of manufacturing a semiconductor device, the method comprising;
    providing a semiconductor body of silicon, at a surface thereof, with a first semiconductor region of a first conductivity type, in which region a second semiconductor region of a second conductivity type, opposite to the first conductivity type, is formed forming a pn-junction with the first semiconductor region by the ion implantation of dopant atoms of the second conductivity type into the semiconductor body, and
    wherein, before the introduction of said dopant atoms, an amorphous region is formed in the semiconductor body by an amorphizing implantation of inert atoms, and wherein, after the amorphizing implantation, temporary dopant atoms are implanted in the semiconductor body, and wherein, after introduction of the dopant atoms of the second conductivity type, the semiconductor body is annealed by subjecting it to a heat treatment at a temperature in the range of about 500 to about 800 degrees Celsius,
    after introduction of the dopant atoms of the second conductivity type, controlling the temperature of subsequent manufacturing steps for the semiconductor device to not exceed about 800 degrees Celsius.

12. A method of manufacturing a semiconductor device having a silicon semiconductor body including a first semiconductor region of a first conductivity type, the method comprising:
    implanting inert atoms to form an amorphous region in the first semiconductor region;
    after implanting inert atoms,
        implanting temporary dopant atoms at the amorphous region,
        ion-implanting dopant atoms of a second conductivity type at the amorphous region, the second conductivity type being opposite the first conductivity type; and
    after ion-implanting the dopant atoms of a second conductivity type, annealing the semiconductor device via heat treatment at a temperature in the range of about 550 to about 750 degrees Celsius to recover the amorphous region and to form a second semiconductor region including the dopant atoms of the second conductivity type, the first and second semiconductor regions forming a pn-junction therebetween.

13. The method of claim 12, wherein the step of annealing includes annealing the semiconductor device at a temperature that mitigates deactivation of the dopant atoms of the second conductivity type.

14. The method of claim 12, wherein, after the step of annealing, the temperature of subsequent manufacturing steps for the semiconductor device is controlled to not exceed about 800 degrees Celsius.

15. The method of claim 12, wherein the step of implanting temporary dopant atoms is carried out before the step of ion-implanting dopant atoms of a second conductivity type.

16. The method of claim 12, wherein the step of implanting temporary dopant atoms is carried out after the step of ion-implanting dopant atoms of a second conductivity type.

17. The method of claim 12,
wherein the step of implanting temporary dopant atoms is carried out before the step of ion-implanting dopant atoms of a second conductivity type, and
further including, prior to ion-implanting dopant atoms of a second conductivity type, annealing the semiconductor device via heat treatment at a temperature in the range of about 500 to about 800 degrees Celsius.

18. The method of claim 12, wherein the implanting steps are carried out in part of a channel region of a field-effect transistor, adjacent to an active region, to form an extension of the active region that underlies a surface of the channel region.

19. The method of claim 12, wherein
the first conductivity type is the n-conductivity type;
ion-implanting dopant atoms of a second conductivity type includes ion-implanting Boron atoms; and
implanting temporary dopant atoms includes implanting Fluor atoms.

20. The method of claim 12, wherein implanting inert atoms includes implanting inert atoms selected from the group of: Ge, Si, Ar or Xe.

* * * * *